United States Patent
Chikagawa

(10) Patent No.: US 8,124,883 B2
(45) Date of Patent: *Feb. 28, 2012

(54) CERAMIC MULTILAYER SUBSTRATE AND METHOD FOR MANUFACTURING THE SAME

(75) Inventor: Osamu Chikagawa, Yasu (JP)

(73) Assignee: Murata Manufacturing Co., Ltd., Kyoto (JP)

( * ) Notice: Subject to any disclaimer, the term of this patent is extended or adjusted under 35 U.S.C. 154(b) by 8 days.

This patent is subject to a terminal disclaimer.

(21) Appl. No.: 12/635,782

(22) Filed: Dec. 11, 2009

(65) Prior Publication Data

US 2010/0092742 A1    Apr. 15, 2010

Related U.S. Application Data

(60) Division of application No. 11/738,658, filed on Apr. 23, 2007, now Pat. No. 7,655,103, which is a continuation of application No. PCT/JP2005/019588, filed on Oct. 25, 2005.

(30) Foreign Application Priority Data

Oct. 29, 2004  (JP) .................................. 2004-317312

(51) Int. Cl.
H05K 1/00    (2006.01)

(52) U.S. Cl. ........ 174/260; 174/250; 361/761; 361/763; 361/766

(58) Field of Classification Search .................. 428/210; 174/250–260; 361/761, 763, 766
See application file for complete search history.

(56) References Cited

U.S. PATENT DOCUMENTS

5,384,434 A * 1/1995 Mandai et al. ................ 174/258

OTHER PUBLICATIONS

Chikagawa; "Ceramic Multilayer Substrate and Method for Manufacturing the Same"; U.S. Appl. No. 11/738,658, filed Apr. 23, 2007.

* cited by examiner

*Primary Examiner* — Cathy Lam
(74) *Attorney, Agent, or Firm* — Keating & Bennett, LLP

(57) ABSTRACT

In a method for manufacturing a ceramic multilayer substrate, when a green ceramic stack prepared by stacking a plurality of ceramic green sheets is fired simultaneously with a ceramic chip electronic component disposed inside the green ceramic stack and including an external terminal electrode to produce a ceramic multilayer substrate having the ceramic chip electronic component inside, a paste layer is disposed in advance between the ceramic chip electronic component and the green ceramic stack, and these three are fired.

4 Claims, 8 Drawing Sheets

CERAMIC MULTILAYER SUBSTRATE AND METHOD FOR MANUFACTURING THE SAME

BACKGROUND OF THE INVENTION

1. Field of the Invention

The present invention relates to ceramic multilayer substrates and methods for manufacturing the same, and more particularly, to a ceramic multilayer substrate having a ceramic chip electronic component inside and a method for manufacturing the same.

2. Description of the Related Art

Japanese Examined Patent Application Publication No. 06-32378 (Patent Document 1) discloses an electronic component-embedding multilayer ceramic substrate and Japanese Unexamined Patent Application Publication No. 2002-084067 (Patent Document 2) discloses a multilayer ceramic substrate and a method for manufacturing the same.

The electronic component-embedding multilayer ceramic substrate disclosed in Patent Document 1 includes a multilayer ceramic substrate, a ceramic chip electronic component disposed in a recess or a space defined by a through hole in the multilayer ceramic substrate, and conductors wiring the chip electronic component and disposed between layers or in spaces of the multilayer ceramic substrate. Since the chip electronic component is disposed in a space of the multilayer ceramic substrate, the resulting multilayer ceramic substrate can have a desired shape so as to ensure flatness.

In the multilayer ceramic substrate and its manufacturing method disclosed in Patent Document 2, functional elements, such as a capacitor element, an inductor element, and a resistor element, are prepared in advance using plate-shaped sintered compact plates (corresponding to the ceramic chip electronic component) that are prepared by previously firing the ceramic functional elements, and these functional elements are embedded in a green multilayer composite. The green multilayer composite includes a green base layer, a constraining layer including a sintering-resistant material, and wiring conductors. When the green multilayer composite is fired, the constraining layer constrains the shrinkage of the green base layer in the main surface direction. Such a constrained sintering process using the constraining layer allows the green multilayer composite to be fired with the embedded ceramic functional elements without problems, and prevents mutual diffusion between the constituents of the ceramic functional elements and the green base layer. Thus, the functional elements maintain their properties even after firing.

Unfortunately, the multilayer ceramic substrates disclosed in Patent Documents 1 and 2 are manufactured by firing a stack of ceramic green sheets having a ceramic chip electronic component disposed therein. Consequently, the ceramic chip electronic component embedded in the fired multilayer ceramic substrate may be cracked or broken. This occurs in the constrained sintering process using a constraining layer. In addition, since the multilayer ceramic substrate is fired with the ceramic chip electronic component in close contact with the ceramic green sheets, it is difficult to prevent the mutual diffusion between the constituents of the ceramic chip electronic component and ceramic layers. Even the technique disclosed in Patent Document 2 may degrade the properties of the resulting chip electronic component.

Furthermore, in a multilayer ceramic substrate having a recess or through hole defining a cavity into which the ceramic chip electronic component is disposed, as disclosed in Patent Document 1, the strength of the substrate around the cavity may be significantly degraded.

SUMMARY OF THE INVENTION

To overcome the problems described above, preferred embodiments of the invention provide a highly reliable ceramic multilayer substrate including a ceramic chip electronic component with no damage, such as cracks, whose properties are not degraded, and provide a method for manufacturing the same.

The inventers of the present invention have studied the cause of the damage to the ceramic chip electronic component embedded in a ceramic multilayer substrate.

As a result, the inventors discovered that when the ceramic layers of the ceramic multilayer substrate have a thermal expansion coefficient that is substantially different from that of the ceramic chip electronic component, the ceramic chip electronic component is likely to crack or break. If the shrinkage of the substrate in its surface direction is reduced by providing a constrained sintering process, a non-shrinking ceramic chip electronic component can be embedded. However, ceramic chip electronic components, such as monolithic ceramic capacitors, are often made of a high-dielectric constant material, and high-dielectric constant materials generally have high thermal expansion coefficients. In contrast, for the ceramic layer, the green ceramic layer is often made of a low-dielectric constant material and low-dielectric constant materials generally have low thermal expansion coefficients.

Accordingly, if the ceramic chip electronic component and the green ceramic layers in close contact with each other are fired together and then cooled to room temperature, the ceramic chip electronic component shrink much more than the ceramic layers during cooling, and consequently, a tension from the ceramic layers is imposed on the ceramic chip electronic component. The ceramic chip electronic component is made of a ceramic material. Since ceramic materials are less resistant to tensile stress, the ceramic chip electronic component is cracked or broken by the tension from the ceramic layers. Accordingly, the material of the ceramic chip electronic component embedded in the ceramic multilayer substrate is limited. In other words, the disadvantages that the ceramic chip electronic component is damaged and that the material of the ceramic chip electronic component is limited can be eliminated, unless the ceramic chip electronic component and the ceramic layers are in close contact with each other.

A method for manufacturing a ceramic multilayer substrate according to a preferred embodiment of the present invention manufactures a ceramic multilayer substrate by simultaneously firing a green ceramic stack prepared by stacking a plurality of green ceramic layers and a ceramic chip electronic component including a terminal electrode and an elementary body made of a ceramic sintered compact and disposed inside the green ceramic stack. In the method, a contact inhibitor is disposed between the ceramic chip electronic component and the green ceramic stack, and the green ceramic stack, the ceramic chip electronic component, and the contact inhibitor are fired together.

Preferably, the contact inhibitor is disposed on the surface of the ceramic sintered compact.

The contact inhibitor may be a resin that burns or decomposes at a temperature less than or equal to the sintering temperature of the green ceramic layers.

Alternatively, the contact inhibitor may be a ceramic powder that is not substantially sintered at the sintering temperature of the green ceramic layers.

Preferably, the green ceramic layers are made of a low-temperature co-fired ceramic material, and a conductor pattern primarily including silver or copper is provided inside the green ceramic stack.

The method for manufacturing the ceramic multilayer substrate according to a preferred embodiment further includes the step of disposing a shrinkage retardant layer made of a sintering-resistant powder not substantially sintered at the sintering temperature of the green ceramic layers on either or both main surfaces of the green ceramic stack.

A ceramic multilayer substrate according to another preferred embodiment includes a ceramic stack including a plurality of stacked ceramic layers and a conductor pattern, and a ceramic chip electronic component disposed at the interface between any two adjacent layers of the ceramic layers. The ceramic chip electronic component includes a terminal electrode and an elementary body made of a ceramic sintered compact. The elementary body includes a gap at the interface between the elementary body and the ceramic stack.

A ceramic multilayer substrate another preferred embodiment includes a ceramic stack including a plurality of stacked ceramic layers and a conductor pattern, and a ceramic chip electronic component disposed at the interface between any two adjacent layers of the ceramic layers. The ceramic chip electronic component includes a terminal electrode and an elementary body made of a ceramic sintered compact. The elementary body includes a green ceramic powder at the interface between the elementary body and the ceramic stack.

Preferably, the ceramic layers are low-temperature co-fired ceramic layers.

Preferred embodiments of the present invention provides a highly reliable ceramic multilayer substrate including a ceramic chip electronic component with no damage, such as cracks, whose properties are not degraded, and a method for manufacturing the ceramic multilayer substrate.

Other features, elements, steps, characteristics and advantages of the present invention will become more apparent from the following detailed description of preferred embodiments of the present invention with reference to the attached drawings.

BRIEF DESCRIPTION OF THE DRAWINGS

FIG. 1A is a sectional view of the entire ceramic multilayer substrate; and 1B is a fragmentary enlarged sectional view of the essential portions of the ceramic multilayer substrate.

FIG. 2A is a sectional view of a ceramic green sheet; FIG. 2B is a sectional view of the state in which ceramic chip electronic components are disposed on the ceramic green sheet shown in FIG. 2A; and FIG. 2C is an enlarged sectional view of the ceramic chip electronic component shown in FIG. 2B.

FIG. 4A is a sectional view of the green ceramic stack before firing; FIG. 4B is a sectional view of the ceramic multilayer substrate after firing; and FIG. 4C is a sectional view of a state of the ceramic multilayer substrate shown in FIG. 4B on which surface mount components are disposed.

FIG. 5A is a sectional view of the entire ceramic multilayer substrate; and FIG. 5B is a fragmentary enlarged sectional view of the essential portions of the ceramic multilayer substrate.

FIG. 6A is a sectional view immediately before embedding the ceramic chip electronic component; and FIG. 6B is a sectional view immediately after embedding the ceramic chip electronic component.

DETAILED DESCRIPTION OF PREFERRED EMBODIMENTS

Figure 1A:
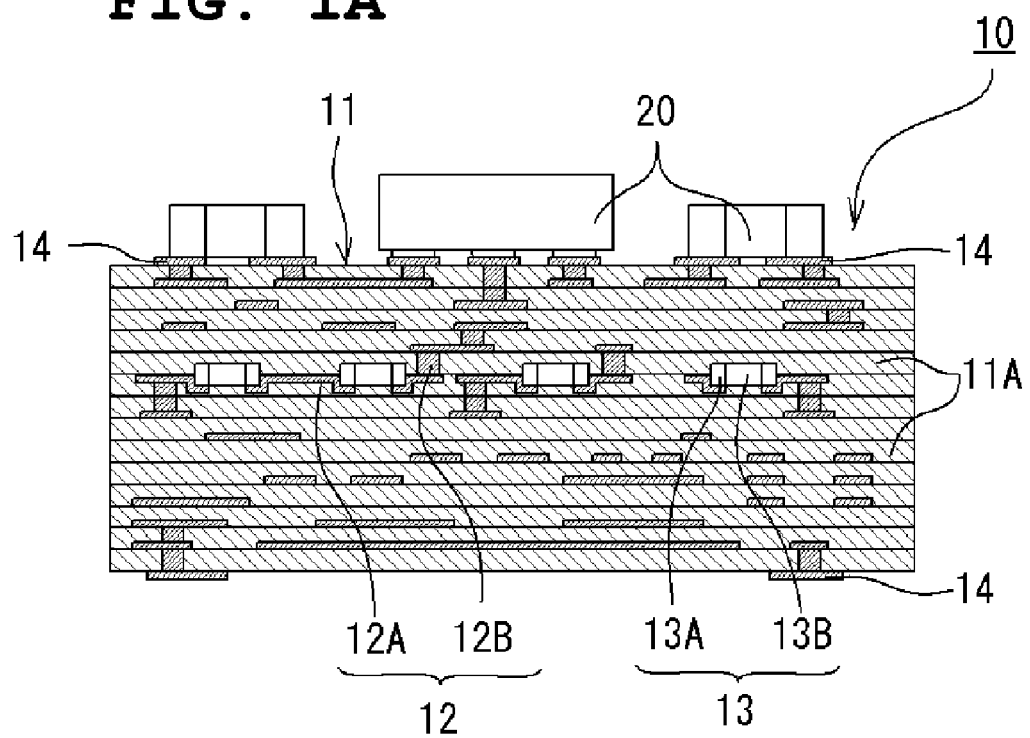
FIGS. 1A and 1B show a ceramic multilayer substrate according to a preferred embodiment of the present invention.

The present invention will described with reference to the preferred embodiments shown in FIGS. 1A to 9.
First Preferred Embodiment A ceramic multilayer substrate 10 according to the present preferred embodiment includes a ceramic stack 11 including a plurality of stacked ceramic layers 11A and an internal conductor pattern 12, and a plurality of ceramic chip electronic components 13 disposed at the interface between any two adjacent upper and lower ceramic layers 11A, as shown in FIG. 1A. Each ceramic chip electronic component 13 includes an elementary body made of a ceramic sintered compact, and external terminal electrodes 13A at both ends of the elementary body. Surface electrodes 14 are disposed on both main surfaces of the ceramic stack 11 (upper and lower surfaces).

A plurality of surface mount components 20 are mounted on one main surface (upper surface in the present preferred embodiment) of the ceramic stack 11 with the surface electrodes 14 provided between the surface mount components 20 and the ceramic stack 11. The surface mount components 20 include semiconductor elements, active elements, such as gallium arsenide semiconductor elements, and passive elements such as capacitors, inductors, and resistors. These surface mount components are electrically connected to the surface electrodes 14 on the upper surface of the ceramic stack 11 via solder, electroconductive resin, or bonding wires made of Au, Al, Cu and other suitable metal. The surface mount components 20 are electrically connected to the ceramic chip electronic components 13 with the surface electrodes 14 and the internal conductor pattern 12. The ceramic multilayer substrate 10 can be mounted on a mounting substrate, such as a mother board, using surface electrodes 14 on the other main surface (lower surface in the present preferred embodiment).

Although the material of the ceramic layers 11A of the ceramic stack 11 is not particularly limited as long as it is a ceramic material, for example, a low-temperature co-fired ceramic (LTCC) material is preferred. Low-temperature co-fired ceramic materials can be sintered at temperatures of about 1050° C. or less and can also be fired simultaneously with silver, copper, or other metal having a low specific resistance. Exemplary low-temperature co-fired ceramics include glass-mixed LTCC materials prepared by mixing borosilicate glass with a ceramic powder such as alumina or forsterite, crystallized glass LTCC materials containing ZnO—MgO—$Al_2O_3$—$SiO_2$ crystallized glass, and non-glass LTCC materials containing BaO—$Al_2O_3$—$SiO_2$ ceramic powder or $Al_2O_3$—CaO—$SiO_2$—MgO—$B_2O_3$ ceramic powder.

The use of a low-temperature co-fired ceramic material as the material of the ceramic stack 11 enables the internal conductor pattern 12 and the surface electrodes 14 to be made of a low-resistance, low-melting point metal, such as Ag or Cu. Consequently, the ceramic stack 11 and the internal conductor pattern 12 can be simultaneously fired at a low temperature of about 1050° C. or less.

A high-temperature co-fired ceramic (HTCC) material may be used as the ceramic material. The high-temperature co-fired ceramic material may be prepared by sintering alumina, aluminium nitride, mullite, or other suitable material including a sintering agent, such as glass, at about 1100° C. or more. In this instance, the internal conductor pattern 12 and the surface electrodes 14 are preferably made of a metal selected from the group consisting of molybdenum, platinum, palladium, tungsten, nickel, and their alloys.

The ceramic stack 11 includes the internal conductor pattern 12 provided inside and the surface electrodes 14 provided on both the upper and the lower surface, as shown in FIG. 1A. The internal conductor pattern 12 includes in-plane conductors 12A arranged in a predetermined pattern along the interface between any two adjacent upper and lower ceramic layers 11A and via conductors 12B arranged in a predetermined pattern so as to connect some of the in-plane conductors 12A in the vertical direction.

Figure 1B:
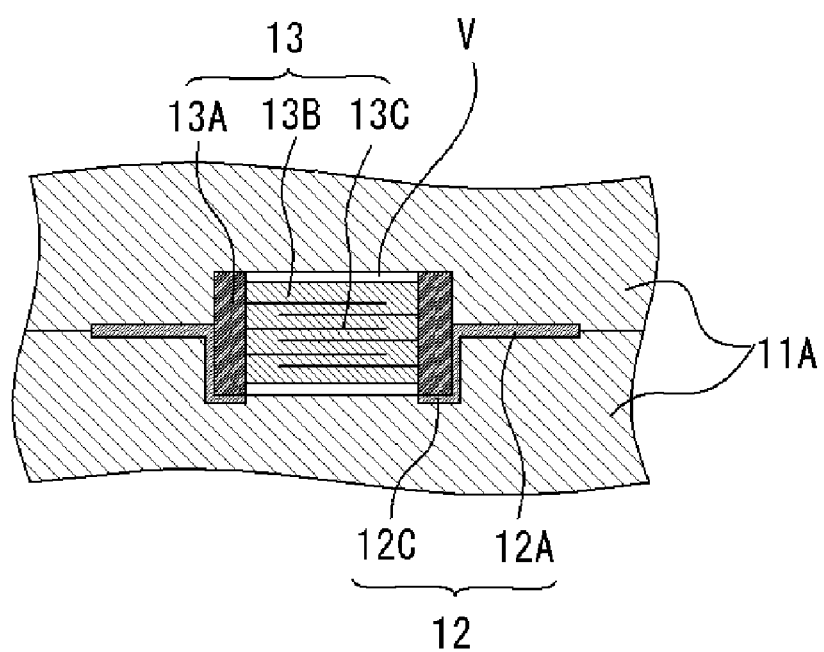

The ceramic chip electronic components 13 are disposed at the interface between any two adjacent upper and lower ceramic layers 11A, and their external terminal electrodes 13A are connected to the in-plane conductors 12A provided at the interface between those two upper and lower ceramic layers 11A, as shown in FIGS. 1A and 1B. The connection portion 12C of the in-plane conductor 12A to the external terminal electrode 13A is pressed into the ceramic layer 11A together with the ceramic chip electronic component 13 such that its section forms a substantially L-shape from the lower half of the end surface of the external terminal electrode 13A to the bottom surface. As shown in FIG. 1B, a gap V is provided between the ceramic layers 11A and the ceramic chip electronic component 13 except the external terminal electrodes 13A, that is, the elementary ceramic body 13B. Thus, the elementary ceramic body 13B is separate from the ceramic layers 11A. The gap V is formed using a contact inhibitor in a firing step, as described below. The gap prevents damage to the ceramic chip electronic component 13 during firing, resulting from the difference in thermal expansion coefficient between the ceramic chip electronic component 13 and the ceramic layers 11, and also prevents the mutual diffusion between the constituents of the elementary ceramic body 13B and the ceramic layers.

The type of ceramic chip electronic component 13 is not particularly limited, and may use a ceramic sintered compact of barium titanate, ferrite, or other suitable material fired at a temperature of about 1050° C. or more, and further about 1200° C. or more, as the elementary body. Exemplary ceramic chip electronic components include monolithic ceramic capacitors as shown in FIG. 1B, inductors, filters, baluns, and couplers. A single or a plurality of ceramic chip electronic components can be appropriately selected from these components depending on the application. The ceramic chip electronic component 13 used in the present preferred embodiment includes an elementary ceramic body 13B including a plurality of stacked ceramic layers and a plurality of internal electrodes 13C each extending from one of the external terminal electrodes 13A toward the other external terminal electrode 13A, the external electrodes 13A face each other. Each ceramic layer of the elementary ceramic body 13B and the internal electrodes 13C overlying and underlying the ceramic layer define a capacitor.

As shown in FIG. 1A, the plurality of ceramic chip electronic components 13 are disposed inside the ceramic stack 11. The plurality of ceramic chip electronic components 13 are the same type, including substantially the same number of ceramic layers made of substantially the same material with substantially the same thickness, and are disposed on the same ceramic layer 11A at the same depth from the upper surface of the ceramic stack 11, as shown in FIG. 1A. Since the plurality of ceramic chip electronic components 13 are disposed at the same interface, a larger pressure or larger contraction force imposed on the ceramic chip electronic components 13 during firing can act substantially uniformly on each ceramic chip electronic component 13. Consequently, the variations in properties of the plurality of ceramic chip electronic components 13 are minimized.

In each ceramic chip electronic component 13, the ceramic layers of the elementary ceramic body 13B and the internal electrodes 13C are disposed substantially parallel to the interfaces of the ceramic layers 11A, as shown in FIG. 1B. Since the ceramic layers of the elementary ceramic body 13B are substantially parallel to the ceramic layers 11A, a pressure or contraction force in the direction that is substantially perpendicular to the interface of the ceramic layers 11A, if the pressure or the contraction force is imposed, acts on the ceramic chip electronic component 13 in the direction that is substantially perpendicular to the interface. Consequently, cracks are prevented in the ceramic chip electronic component 13.

When the thickness and the length in the longitudinal direction of the ceramic chip electronic component 13 are defined as A and B respectively, it is preferable that the thickness A and the length B satisfy the relationship $2 \leq (B/A) \leq 40$. If B/A is less than 2, the thickness of the ceramic chip electronic component 13 is relatively large. Accordingly, the ceramic chip electronic component is more likely to be affected by piezoelectric effect resulting from compression, and thus, the properties vary easily. If B/A increases to more than 40, the thickness of the ceramic chip electronic component 13 is reduced and the mechanical strength is reduced accordingly. Consequently, the ceramic chip electronic component is more likely to be broken when it is pressed. The thickness of the ceramic chip electronic component refers to the thickness in the direction in which the ceramic layers are stacked.

Although it is preferable that the plurality of ceramic chip electronic components 13 are disposed on the same ceramic layer 11A, they may be located in any location along the interface of the upper and lower ceramic layers as required. Sets of a plurality of ceramic chip electronic components 13 may be disposed at a plurality of interfaces that have different vertical positions. The ceramic chip electronic components 13 in each set are connected in series and/or in parallel using the connection portions 12C of the in-plane conductors 12A according to the application. Thus, a multifunctional, high-performance ceramic multilayer substrate 10 is achieved.

The surface mount components 20 are appropriately used in combination with the ceramic chip electronic components 13, as shown in FIG. 1A. The ceramic chip electronic components 13 and the surface mount components 20 are electrically connected to each other through the surface electrodes 14 and the internal conductor pattern 12. If a component that is likely to be affected by power supply noises, such as an integrated circuit, is used as a surface mount component 20, a monolithic ceramic capacitor may be connected as the ceramic chip electronic component 13 right under the power terminal and the grounding terminal. Thus, noises can be efficiently removed so that, for example, power can be stably supplied and the output oscillation can be prevented, without limiting the arrangement of the terminals of the surface mount components 20, such as integrated circuits, or mounting a ceramic chip electronic component (for example, a monolithic ceramic capacitor) on another mother board.

A method for manufacturing the ceramic multilayer substrate 10 will be described with reference to FIGS. 2A to 4C.

In the present preferred embodiment, the ceramic multilayer substrate 10 is produced by a constrained sintering process. The constrained sintering process is a method in which the size of a ceramic stack 11 using a ceramic material is not substantially varied in its surface direction even after sintering the ceramic stack.

Figure 2A:
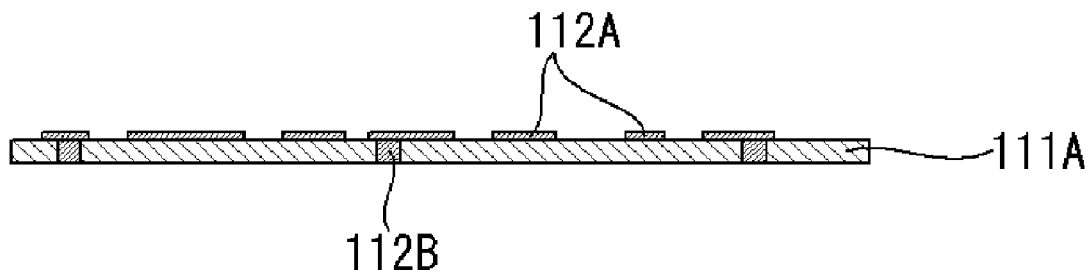
FIGS. 2A to 2C are process views of a manufacturing process of the ceramic multilayer substrate shown in FIGS. 1A and 1B.
Figure 2B:
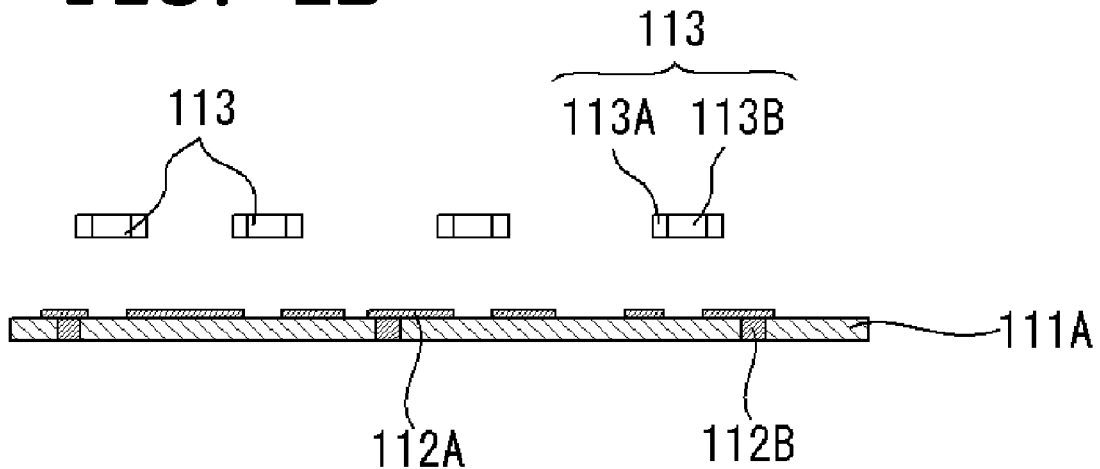

In the present preferred embodiment, first, a predetermined number of ceramic green sheets are formed of a slurry including, for example, a low-temperature co-fired ceramic material. In one or some of the ceramic green sheets 111A, on which the ceramic chip electronic components 113 including the elementary bodies made of a ceramic sintered compact are disposed, via holes are formed in a predetermined pattern, as shown in FIGS. 2A and 2B. The via holes are filled with an electroconductive paste primarily including, for example, Ag or Cu, to form via conductors 112B. Then, the same electroconductive paste is applied onto the ceramic green sheet 111A in a predetermined pattern to form in-plane conductors 112A. The in-plane conductors 112A and the via conductors 112B are appropriately connected. The other ceramic green sheets 111A are formed in the same manner.

In the description, the ceramic chip electronic components before firing are designated by reference numeral "113" and those after firing and cooling are designated by reference numeral "13".

Figure 2C:
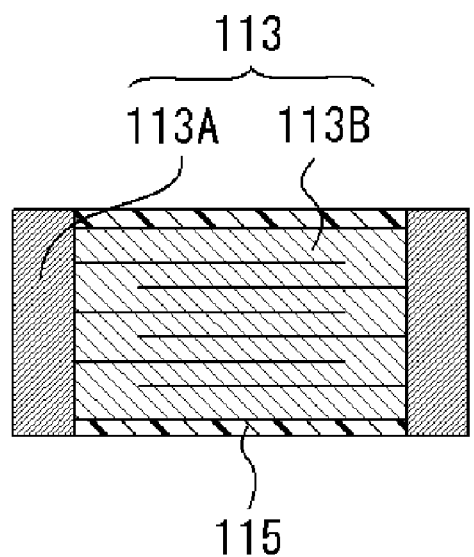

Ceramic chip electronic components 113, each including an elementary body made of a ceramic sintered compact, as shown in FIG. 2C, is prepared. A resin paste prepared from a thermally decomposable resin is applied as a contact inhibitor over substantially the entire surfaces of the elementary ceramic body 113B of the ceramic chip electronic component 113 except the external terminal electrodes 113A, and thus, a paste layer 115 is preferably formed to a thickness of about 1 μm to about 30 μm, for example. The contact inhibitor is preferably formed over substantially the entire surfaces of the elementary ceramic body 113B, and the contact inhibitor must be formed on at least a portion of the surfaces, especially, it is preferably formed at the upper and lower surface, which added large pressure.

Any material can be used as the contact inhibitor as long as it prevents mutually diffusion of the constituents between the ceramic chip electronic component 113 and the ceramic green sheet 111A during firing, and it can form a non-constraining region where the ceramic chip electronic component 113 can shrink after firing. Such a contact inhibitor may be a resin that can be burned or decomposed to form a gap V by firing, as in the present preferred embodiment, or a ceramic powder that does not sinter to adhere to the elementary ceramic body 13B by firing. Burnable resins include, for example, butyral resins. Decomposable resins include, for example, acrylic resins. The ceramic powder can be, for example, the below-described sintering-resistant powder. The resin paste may be a low-temperature co-fired ceramic material to the extent that the formation of the gap is not hindered.

After forming the paste layers 115 on the elementary ceramic bodies 113B of the ceramic chip electronic components 113, an organic adhesive is applied or sprayed using a spray or the like onto the in-plane conductors 112A of the ceramic green sheet 111A on which the ceramic chip electronic components 113 are to be disposed, thus forming an organic adhesive layer (not shown). Then, the ceramic chip electronic components 113 are disposed on the ceramic green sheet 111A in a state where the external terminal electrodes 113A of the ceramic chip electronic components 113 are aligned with the in-plane conductors 112A of the ceramic green sheet 111A as shown in FIG. 2B. The external terminal electrodes 113A of each ceramic chip electronic component 113 are bonded and fixed to the in-plane conductors 112A through the organic adhesive layer. The organic adhesive can be a mixture of a synthetic rubber or synthetic resin and a plasticizer. The thickness of the organic adhesive layer is preferably about 3 μm or less when it is formed by coating, or about 1 μm or less when it is formed by spraying, for example.

Figure 3:
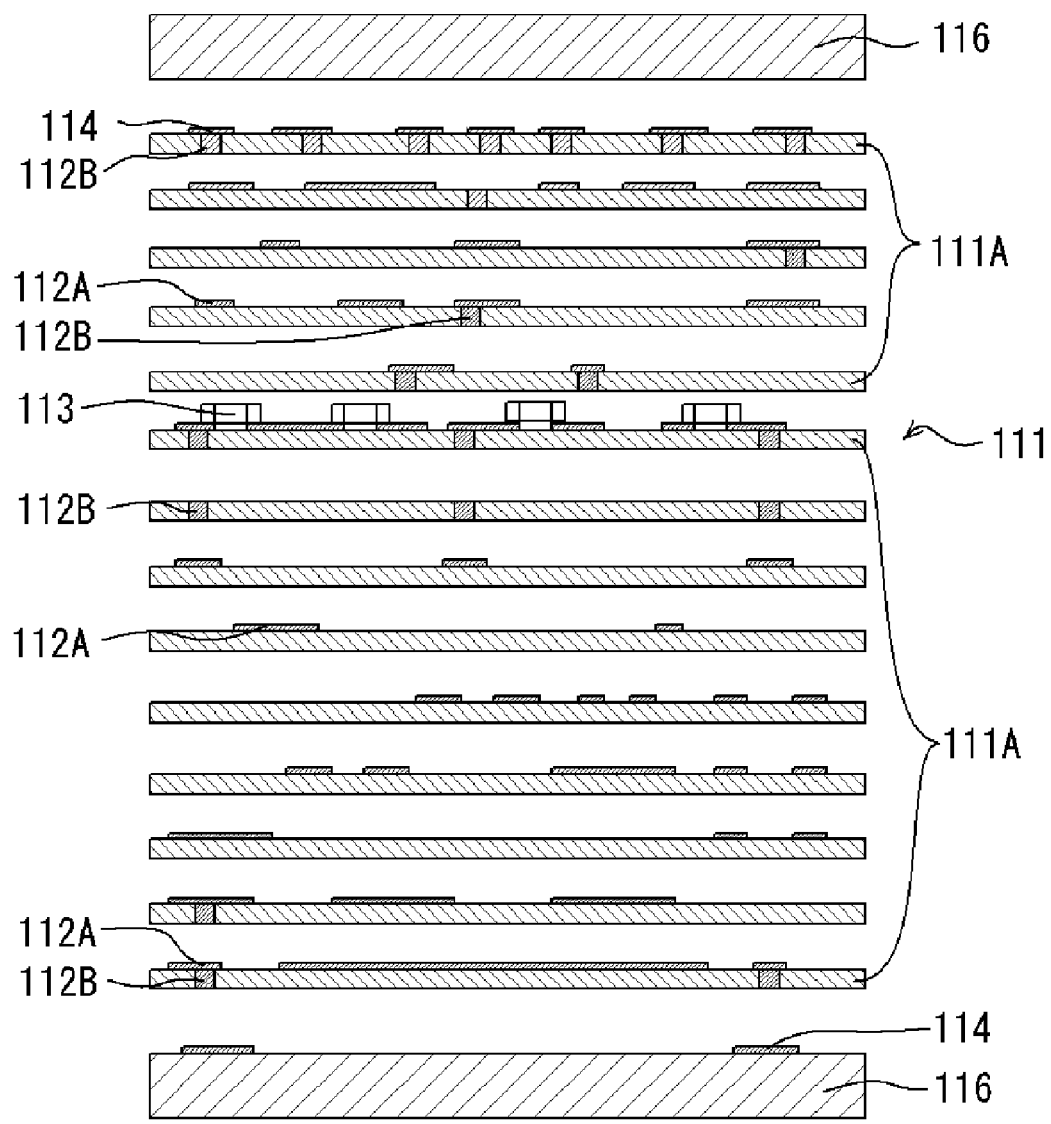
FIG. 3 is a sectional view of the step of forming a green ceramic stack in the manufacturing process of the ceramic multilayer substrate shown in FIGS. 1A and 1B.

Then, the ceramic green sheets 111A having the in-plane conductors 112A and the via conductors 112B and the ceramic green sheet 111A, on which the ceramic chip electronic components 113 are disposed, are stacked on a constraining layer 116 in a predetermined order, as shown in FIG. 3. The uppermost ceramic green sheet 111A having the surface electrodes 114 is disposed on top of the stack. Thus, a green ceramic stack 111 is formed on the constraining layer 116. Furthermore, another constraining layer 116 is stacked on the upper surface of the green ceramic stack 111. The green ceramic stack 111 is thermocompression-bonded at a predetermined pressure from the upper and lower constraining layers 116 at a predetermined temperature to prepare a compressed body 110 shown in FIG. 4A. The constraining layer 116 is a sheet formed of a sintering-resistant powder (ceramic powder having a high sintering temperature, such as $Al_2O_3$) not sintered at the sintering temperature of the green ceramic stack 111, for example, a slurry including $Al_2O_3$ as the main constituent and an organic binder as an accessory constituent.

Figure 4A:
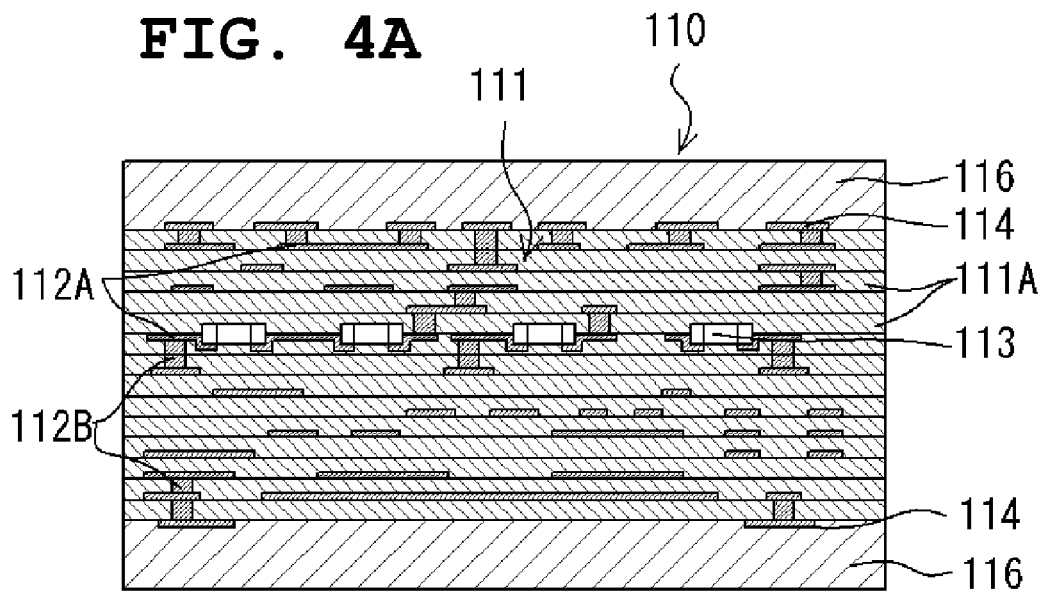
FIGS. 4A to 4C are sectional views of states in the manufacturing process of the ceramic multilayer substrate shown in FIGS. 1A and 1B.
Figure 4B:
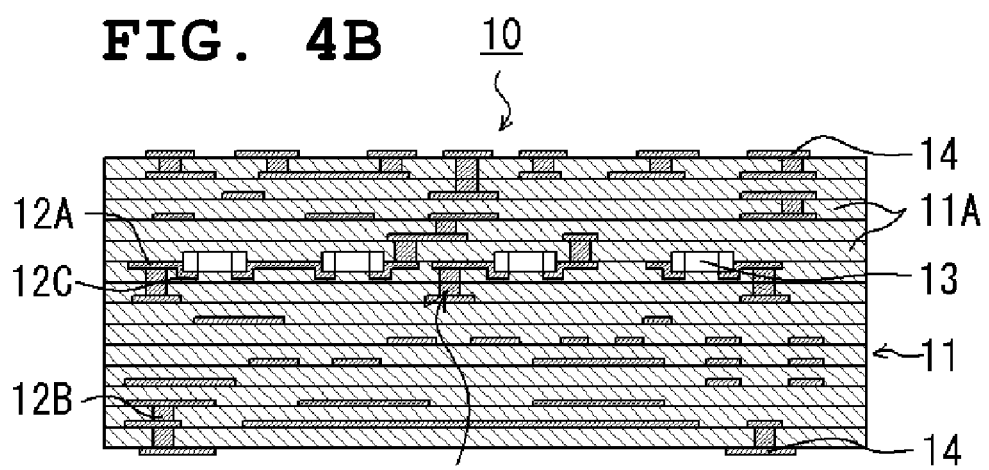

Then the compressed body 110 shown in FIG. 4A is fired at about 870° C. in an atmosphere of air to complete the ceramic multilayer substrate 10 shown in FIG. 4B. The firing temperature is preferably a temperature at which the low-temperature co-fired ceramic material can be sintered, and for example, it is in the range of about 800° C. to about 1050° C. Firing at a temperature of less than about 800° C. may not sufficiently sinter the ceramic components of the green ceramic stack 111. Firing at a temperature of more than about 1050° C. may melt the metal particles of the internal conductor pattern 12 to diffuse the metal in the green ceramic stack 111.

When the green ceramic stack 111 is fired, the paste layer 115 formed over the external surfaces of the elementary ceramic body 113B of the ceramic chip electronic component 113 is burned or decomposed, so that narrow gaps V are formed between the elementary ceramic body 113B of each ceramic chip electronic component 113 and the ceramic green sheets 111A, as shown in FIG. 1B. Consequently, the constituents of the ceramic layers 11A and the elementary ceramic body 113B of the ceramic chip electronic component 113 are prevented from mutually diffusing when the ceramic green sheets 111A are sintered. Thus, the properties of the ceramic chip electronic component 13 are not degraded after firing. In addition, the metal particles of the external terminal electrodes 113A of the ceramic chip electronic component 113 and the in-plane conductors 112A integrated during sintering, and thus, the external terminal electrodes 113A and the in-plane conductors 112A are connected to each other.

The ceramic chip electronic component 113 is securely connected to and integrated with the in-plane conductors 112A with the external terminal electrodes 113A by firing. Also, the gap V is formed between each ceramic chip electronic component and the ceramic green sheets 111A by burning or decomposition of the paste layer 115. Consequently, even if the ceramic chip electronic component 13 and the ceramic layers 11A have a large difference in thermal expansion coefficient during cooling after firing, the ductile in-plane conductors 12A can elongate accompanying the shrinkage of the ceramic chip electronic component 13. Thus, the ceramic chip electronic component 13 does not suffer from a strain, and cracks in or other damage to the ceramic chip electronic component 13 are prevented.

Figure 4C:
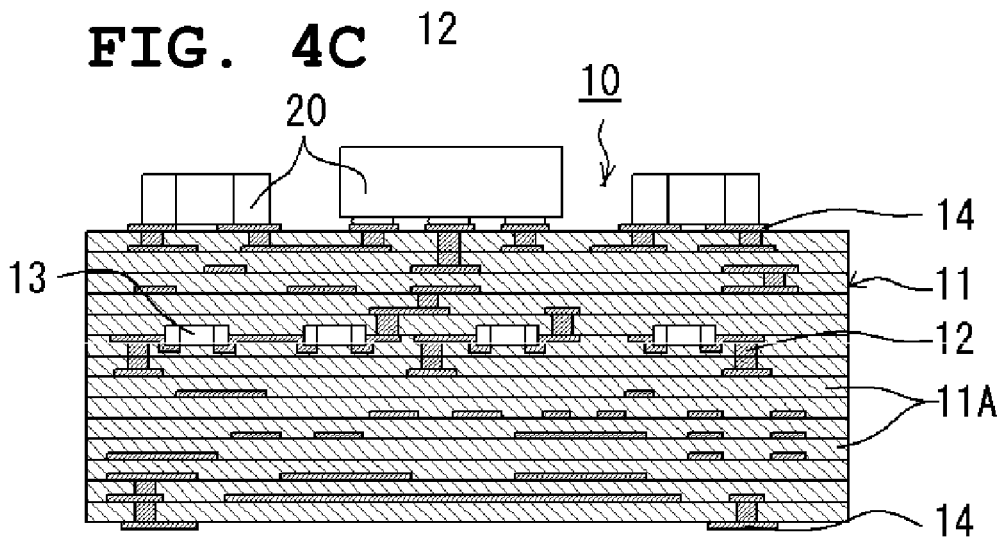

After firing, the upper and lower constraining layers 116 are removed by blasting or ultrasonic cleaning to complete the ceramic multilayer substrate 10. In addition, predetermined surface mount components 20 are mounted on the surface electrodes 14 of the ceramic multilayer substrate 10 by, for example, soldering, as shown in FIG. 4C. Thus, an end product is completed. The external terminal electrodes 113A of the ceramic chip electronic component 113 may be an electroconductive paste that has been applied and baked, or an electroconductive paste that has been applied and dried, but not yet baked.

In the present preferred embodiment, a ceramic multilayer substrate 10, having ceramic chip electronic components 13 inside, is produced by simultaneously firing a green ceramic stack 111 and ceramic chip electronic components 113, as described above. In this instance, the green ceramic stack 111 is prepared by stacking a plurality of ceramic green sheets 111A. Each ceramic chip electronic component includes an elementary body made of a ceramic sintered compact, and external terminal electrodes 113A disposed at both ends of the elementary body. The ceramic chip electronic components are disposed inside the green ceramic stack 111. For this structure, a paste layer 115 is previously formed on substantially the entire surfaces of the elementary ceramic body 113B, and the ceramic chip electronic components 113, each having the paste layer 115, are disposed at the interface of any adjacent two upper and lower ceramic green sheets 111A. Thus, the ceramic green sheets 111A, the ceramic chip electronic components 113, and the paste layers 115 are fired with each paste layer 115 disposed between the ceramic green sheets 111A and the elementary ceramic body 113B of the ceramic chip electronic component 113. The paste layer 115 is burned or decomposed by firing, thus forming a gap V between the elementary ceramic body 113B of the ceramic chip electronic component 113 and the ceramic green sheets 111A. Consequently, the constituents of the elementary ceramic body 113B of the ceramic chip electronic component 113 and the ceramic layers 11A are prevented from mutually diffusing, so that the properties of the ceramic chip electronic component 13 are not degraded. In addition, the gap V between the ceramic chip electronic component 13 and the ceramic layers 11A enables the ceramic layers 11A to shrink through the ductile in-plane conductors 12A in between without constraint during cooling after firing. Thus, the ceramic chip electronic component 13 does not suffer from a strain, and cracks in or other damage to the ceramic chip electronic component 13 are prevented.

Accordingly, the present preferred embodiment provides a highly reliable ceramic multilayer substrate 10 including ceramic chip electronic components 13 with no damage, such as cracks, whose properties are not degraded.

In the present preferred embodiment, the ceramic layers 11A are preferably low-temperature co-fired ceramic layers. Accordingly, a low-resistance and inexpensive metal, such as Ag or Cu, can be used for the internal conductor pattern 12 and the surface electrodes 14, thus reducing the manufacturing cost and increasing the high-frequency characteristics.

Second Preferred Embodiment

The same or similar parts as in the first preferred embodiment are designated by the same reference numerals in the present preferred embodiment.

Figure 5A:
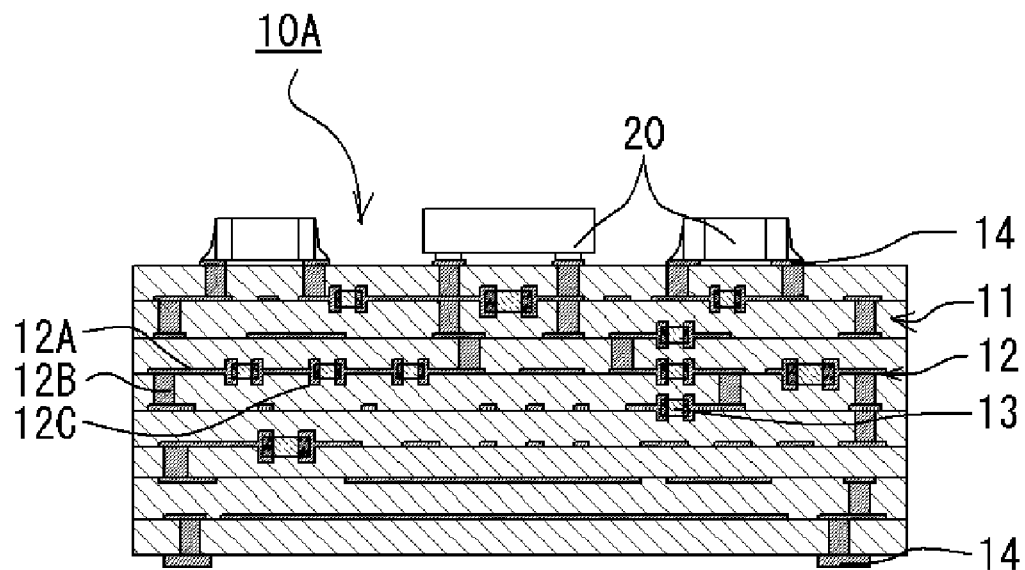
FIGS. 5A and 5B show a ceramic multilayer substrate according to another preferred embodiment of the present invention.
Figure 5B:
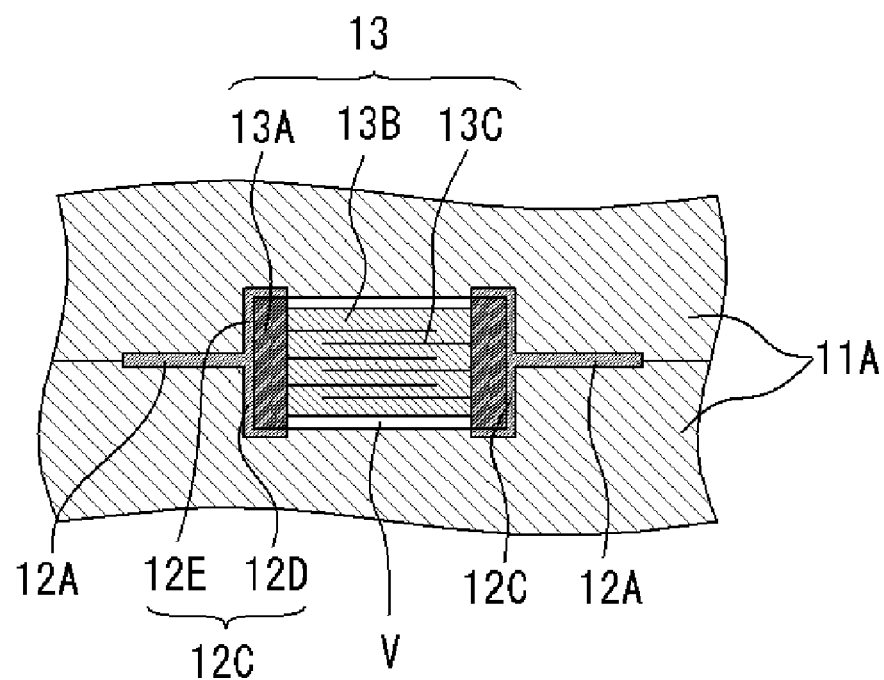

A ceramic multilayer substrate 10A of the present preferred embodiment includes a ceramic stack 11, internal conductor patterns 12, and ceramic chip electronic components 13, and a plurality of surface mount components 20 are disposed on the upper surface of the ceramic stack 11, as shown in, for example, FIGS. 5A and 5B. The ceramic multilayer substrate 10A of the present preferred embodiment has substantially the same structure as the first preferred embodiment, except that the ceramic chip electronic components 13 are connected to the internal conductor patterns 12 in the ceramic stack 11 in a different manner. In other words, gaps V are formed around the elementary ceramic bodies 13B of the ceramic chip electronic components 13 so that the elementary ceramic bodies 13B are separate from the ceramic layers 11A.

For connection in the present preferred embodiment, each ceramic chip electronic component 13 is connected to in-plane conductors 12A through a connection portion 12C. The connection portion 12C is defined by first and second connection conductors 12D and 12E, as shown in FIG. 5B. The first connection conductor 12D extends downward from the in-plane conductor 12A, which is disposed at the interface of the upper and lower ceramic layers 11A, the ceramic chip electronic component 13 is disposed between the upper and lower ceramic layer 11A. The first connection conductor 12D extends to the lower surface of the external terminal electrode 13A along the interface between the lower ceramic layers 11A and the end of the external terminal electrode 13A, thus having an L shape cross-section. The second connection conductor 12E extends upward from the in-plane conductor 12A, which is disposed at the interface of the upper and lower ceramic layers 11A, the ceramic chip electronic component 13 is disposed between the upper and lower ceramic layer 11A. The second connection conductor 12E extends to the upper surface of the external terminal electrode 13A along the interface between the upper ceramic layers 11A and the end of the external terminal electrode 13A, thus having an L shape cross-section, as shown in FIG. 5B. Preferably, the first and second connection conductors 12D and 12E have a width that is greater than or equal to the width of the ceramic chip electronic component 13.

Thus, the first and second connection conductors 12D and 12E define the connection portion 12C arranged so as to extend continuously over the ends of the upper surface and lower surface of the ceramic chip electronic component 13 so as to form a substantially square C-shape (hereinafter simply referred to as "C-shape") that clips the external terminal electrode 13A from the upper and lower surfaces, and of which a cross-sectional view angulates. Thus, the connection portion 12C is electrically connected to three surfaces of the external terminal electrode 13A, and preferably to five surfaces including both side surfaces. The first and second connection conductors 12D and 12E each have a width greater than the line width of the in-plane conductor 12A, so that they are connected to the in-plane conductor 12A with reliability even if they are misaligned with the in-plane conductor 12A in the width direction. Thus, the in-plane conductor 12A and the external terminal electrode 13A are reliably connected to each other.

Figure 6A:
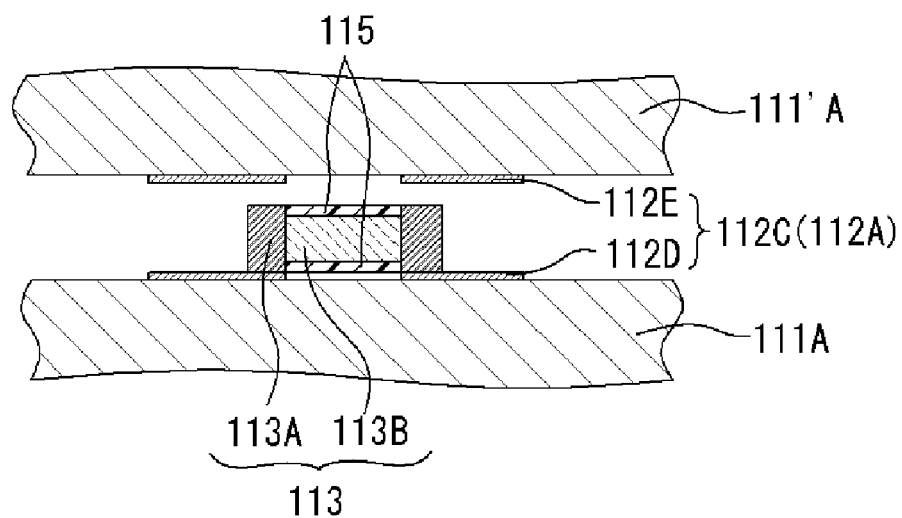
FIGS. 6A and 6B are fragmentary sectional views of essential components of the ceramic multilayer substrate shown in FIGS. 5A and 5B.
Figure 6B:
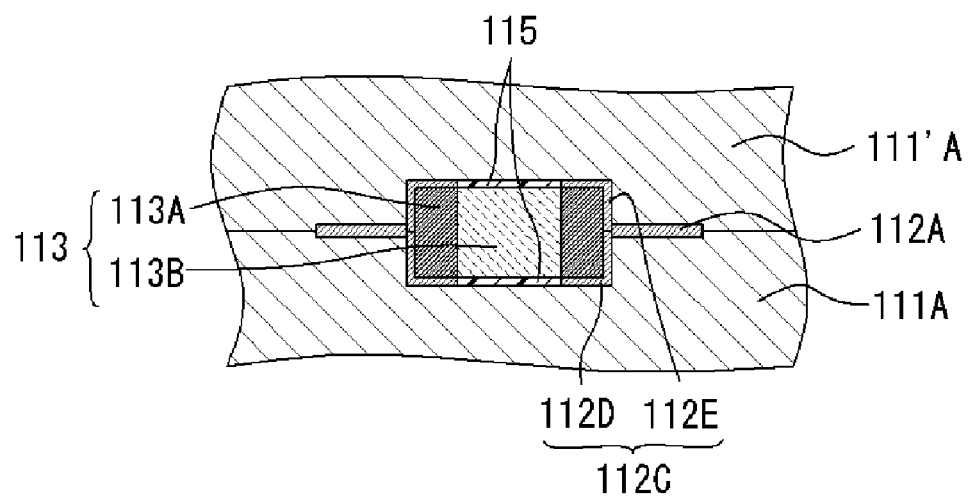

Turning now to FIGS. 6A and 6B, in order to establish the connection of the present preferred embodiment, the ceramic chip electronic components 113 are disposed between the upper and lower ceramic green sheets 111A and 111'A on which the first and second conductive portions 112D and 112E are previously formed by screen printing or other suitable method. Each ceramic chip electronic component 113 includes an elementary body made of a ceramic sintered compact, and a paste layer 115 is formed over the external surfaces of the elementary ceramic body 113B. The ceramic green sheets 111A and 111'A including the ceramic chip electronic components 113 and other ceramic green sheets 111A are stacked in a predetermined order, and are fired with constraining layers sandwiching the stack. Consequently, the paste layer 115 of the ceramic chip electronic component 113 is burned or decomposed to form a gap V around the elementary ceramic body 13B of the ceramic chip electronic component 13, and thus, the ceramic multilayer substrate 10A is completed, as shown in FIG. 5B. In the present preferred embodiment, the ceramic chip electronic component 13 and the in-plane conductors 12A are reliably connected with the connection portions 12C therebetween. Thus, the present preferred embodiment enhances the reliability of the connection while producing the same advantages as in the first preferred embodiment.

Third Preferred Embodiment

In the first and the second preferred embodiment, the contact inhibitor is preferably made of a resin, and the gap V is formed between the elementary ceramic body 13B of the ceramic chip electronic component 13 and the ceramic layers 11A. In the present preferred embodiment, a sintering-resistant powder is preferably used as the contact inhibitor. The sintering-resistant powder is not particularly limited as long as it is not sintered at the sintering temperature of the ceramic layers 11A, as with the above-described constraining layer. For example, a ceramic powder having a sintering temperature greater than the sintering temperature of the ceramic layers 11A, such as $Al_2O_3$, is preferably used. In the present preferred embodiment, the same or similar parts as in the first and second preferred embodiments are designated by the same reference numerals.

Figure 7:
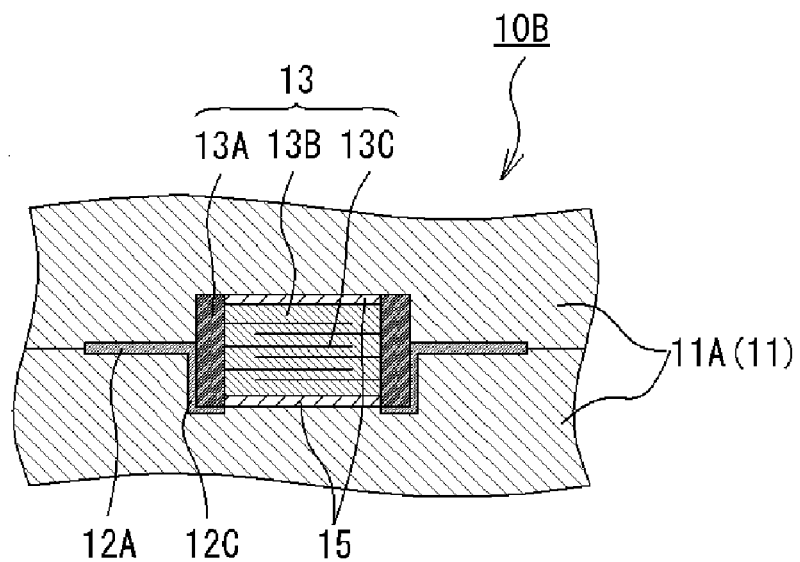
FIG. 7 is a fragmentary enlarged sectional view of essential portions of a ceramic multilayer substrate according to another preferred embodiment of the present invention.

More specifically, the ceramic multilayer substrate 10B of the present preferred embodiment has the same structure as in the first preferred embodiment, except that a powder layer 15 is made of a sintering-resistant powder between the elementary ceramic body 13B of each ceramic chip electronic component 13 and the ceramic layers 11A, as shown in FIG. 7.

The ceramic multilayer substrate 10B is produced preferably in the same manner as in the first and second preferred embodiments, except that a paste (powder paste) of an organic binder primarily including a sintering-resistant powder is applied onto the external surfaces of the elementary ceramic body of the ceramic chip electronic component, instead of the resin paste. Accessory constituents, such as the organic binder, of the powder paste layer are burned or decomposed to disappear during firing, and the sintering-resistant powder does not sinter. Thus, substantially only the sintering-resistant powder remains to form the powder layer 15. When the ceramic chip electronic component 13 shrinks from the swelled state during cooling after firing, it shrinks along the powder layer 15 without being constrained by the ceramic layers 11A. Consequently, cracks in or other damage to the ceramic chip electronic component 13 are prevented.

Since the powder layer 15 is provided between the elementary ceramic body 13B of the ceramic chip electronic component 13 and the ceramic layers 11A, the constituents of the elementary ceramic body 13B and the ceramic layers 11A are reliably prevented from mutually diffusing. Accordingly, the same advantages as in the first and second preferred embodiments are achieved.

Fourth Preferred Embodiment

Figure 8:
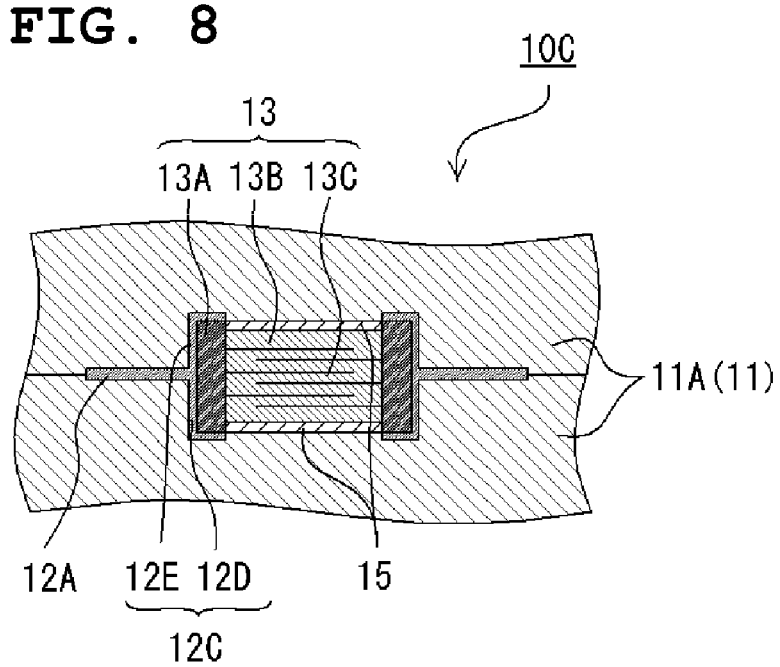
FIG. 8 is a fragmentary enlarged sectional view of essential portions of a ceramic multilayer substrate according to another preferred embodiment of the present invention.

In the present preferred embodiment, the ceramic multilayer substrate 10C has substantially the same structure as in the third preferred embodiment, except that the connection portion 12C of the internal conductor pattern 12 connected to the ceramic chip electronic component 13 in the ceramic stack 11 is different, as shown in FIG. 8. Specifically, in the present preferred embodiment, a powder layer 15 of a sintering-resistant powder is provided between the elementary ceramic body 13B of the ceramic chip electronic component 13 and the ceramic layers 11A, as shown in FIG. 8. The connection portion 12C of the internal conductor pattern 12 connected to the ceramic chip electronic component 13 is defined by first and second connection conductors 12D and 12E, as shown in FIG. 8. The connection is thus provided in substantially the same manner as in the second preferred embodiment. Accordingly, the same advantages as the ceramic multilayer substrate 10B of the third preferred embodiment shown in FIG. 7 are achieved.

Fifth Preferred Embodiment

Figure 9:
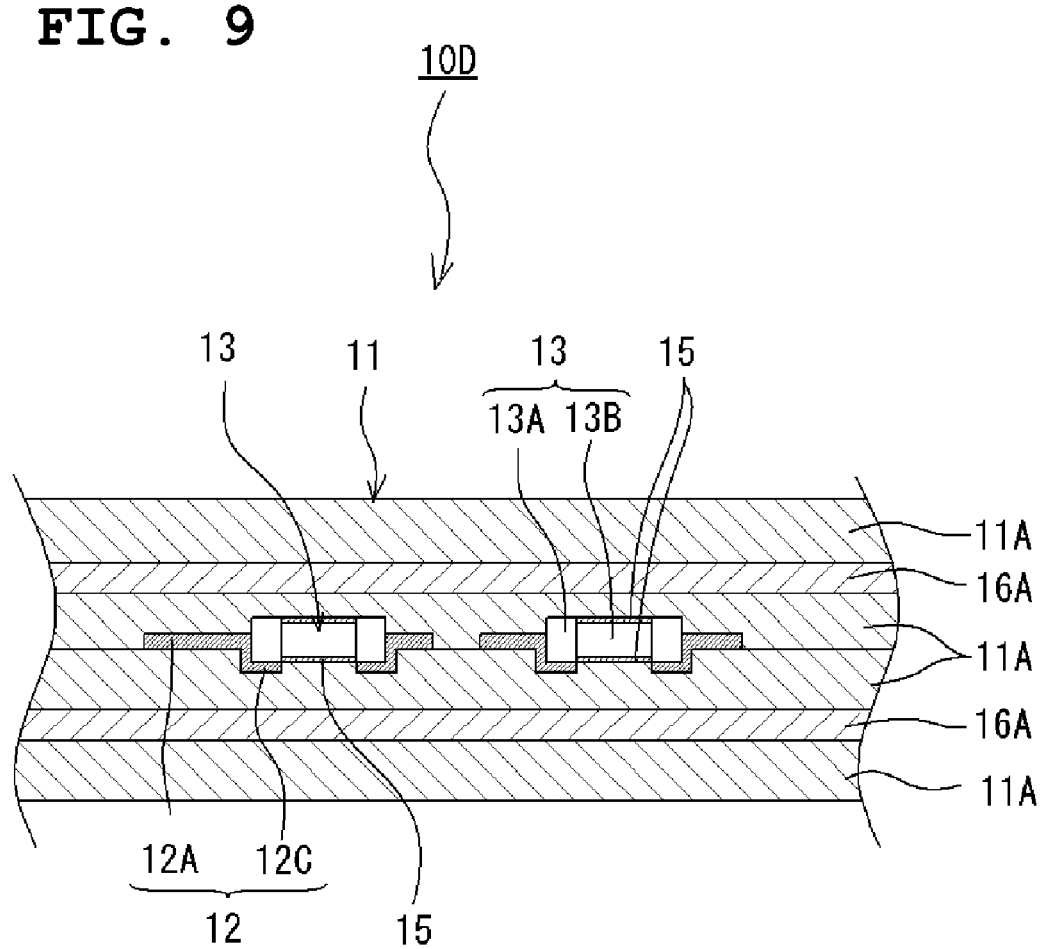
FIG. 9 is a fragmentary enlarged sectional view of essential portions of a ceramic multilayer substrate according to another preferred embodiment of the present invention.

The ceramic multilayer substrate 10D of the present preferred embodiment preferably has the same structure as the ceramic multilayer substrate 10B of the third preferred embodiment shown in FIG. 7 except that constraining layers 16A are appropriately disposed between the ceramic layers 11A, as shown in FIG. 9. Accordingly, in the present preferred embodiment, the same or similar parts as in the third embodiment are designated by the same reference numerals.

In the present preferred embodiment, for preparing the green ceramic stack, composite sheets are each prepared by, for example, stacking a ceramic green sheet and a constraining layer. When the ceramic chip electronic component is disposed inside, in-plane conductors and via conductors are provided at the ceramic green sheet of one of the composite sheets. The ceramic chip electronic component is disposed on this ceramic green sheet. The ceramic chip electronic component, which includes a powder paste layer around the elementary ceramic body, is bonded and fixed to the surface of the ceramic green sheet. Then, other composite sheets are stacked such that the ceramic green sheets face the ceramic chip electronic component. Then, the composite sheets holding the ceramic chip electronic component and the other composite sheets are stacked to prepare the green ceramic stack, followed by firing. When the green ceramic stack is fired, the organic binder of the powder paste layer between the elementary ceramic body of the ceramic chip electronic component and the ceramic green sheets is burned to form a powder layer, and the glass components of the ceramic green sheets diffuse into the constraining layers. The ceramic components of the constraining layer are bound to the glass components and integrated. Thus, the powder layer 15 is formed between the elementary ceramic body 13B of the ceramic chip electronic component 13 and the ceramic layers in the ceramic stack 11, and constraining layers 16A are formed between other upper and lower ceramic layers 11A, as shown in FIG. 9.

In the present preferred embodiment, since the powder layer 15 is disposed between the elementary ceramic body 13B of the ceramic chip electronic component 13 and the ceramic layers 13B, the same advantages as in the third preferred embodiment are produced. In addition, the green ceramic stack is fired with a plurality of constraining layers disposed with predetermined distances in the stacking direction throughout the green ceramic stack. Consequently, the shrinkage in the surface direction of each ceramic layer is uniformly prevented from the surface to the middle of the green ceramic stack during firing. Thus, cracks in the substrate and warpage of the substrate are prevented. While the present preferred embodiment uses the powder layer 15, a gap may be formed instead of the powder layer 15.

While in the above-described preferred embodiments, the contact inhibitor is defined by the paste layer 115 on the surfaces of the elementary ceramic body 113B, the paste layer of the contact inhibitor may be formed on the ceramic green sheets 111A in the region corresponding to the elementary ceramic body 113B.

EXAMPLE 1

In the production of a ceramic multilayer substrate of the present example, a paste layer was formed of a thermally decomposable resin on each ceramic chip electronic component, and the firing was performed by a constrained sintering process. Whether or not strain was applied to the ceramic chip electronic components (monolithic ceramic capacitors) during cooling after firing was determined by whether a crack occurred in the monolithic ceramic capacitors. Also, the capacitances of the embedded monolithic ceramic capacitors were measured, and the degree of mutual diffusion of the material constituents was determined from the variation in the capacitance.

Production of Ceramic Multilayer Substrate

For producing the ceramic multilayer substrate, first, a slurry was prepared using $Al_2O_3$ as filler and a low-temperature co-fired ceramic material including borosilicate glass as a sintering agent. The slurry was applied to carrier films to prepare a plurality of ceramic green sheets. One of the ceramic green sheets was subjected to laser processing to form via holes. Then, an electroconductive paste primarily including Ag powder was forced into the via holes through a metal mask with the ceramic green sheet in close contact with a flat support, thus forming via conductors. The same electroconductive paste was screen-printed on the ceramic green sheet to form in-plane conductors in a predetermined pattern. For the other ceramic green sheets, via conductors and in-plane conductors were appropriately formed in the same manner. The ceramic layer made of the low-temperature co-fired ceramic material has a thermal expansion coefficient of about 7 ppm/° C.

Then, monolithic ceramic capacitors were prepared as the ceramic chip electronic components each including the elementary body made of a ceramic sintered compact. The monolithic ceramic capacitor was made of a ceramic sintered compact (size: 1.0 mm×0.3 mm×0.3 mm; internal electrode: Pd; rated capacitance: about 80 pF; thermal expansion coefficient: about 14 ppm/° C.) fired at about 1300° C., and includes external terminal electrodes at both ends that were formed by applying an electroconductive paste primarily including Ag. The external terminal electrodes were not subjected to plating. The variation in capacitance among the monolithic ceramic capacitors was 3CV=4.0%. Then, a thermally decomposable resin paste was applied to a relatively small thickness to form a paste layer on the external surfaces of the elementary ceramic body of the monolithic ceramic capacitor. Subsequently, an organic adhesive was applied onto predetermined ceramic green sheets by, for example, spraying, thus forming organic adhesive layers on the in-plane conductors. Then, the monolithic ceramic capacitor was aligned with the in-plane conductors by a mounter, and the monolithic ceramic capacitor was bonded and fixed to the in-plane conductors.

In the present example, ten ceramic green sheets of 200 mm by 200 mm whose thickness after firing would be about 50 μm were stacked. A plurality of monolithic ceramic capacitors were disposed in the stack of the ceramic green sheets such that they would be located at a depth of about 250 μm from the surface of the substrate and in the middle in the thickness direction, followed by compression bonding. Ten monolithic ceramic capacitors were embedded for each 10 mm×10 mm region. Thus, 4000 monolithic ceramic capacitors were disposed at the same depth in a compressed body of the 200 mm×200 mm ceramic green sheets.

Sheets defining the constraining layers were disposed on both surfaces of the 200 mm×200 mm compressed body, and the resulting stack was temporarily compression-bonded at a pressure of at least about 10 MPa. Sheets made of $Al_2O_3$ including 0.5 percent by weight of borosilicate glass, which was also used in the ceramic green sheet, were used as the constraining layers. The presence of a small amount of borosilicate glass enhances the adhesion to the substrate and helps the sheets prevent shrinkage. The constraining layers were not sintered at the firing temperature of the ceramic material because the amount of the borosilicate glass is small. Temporal compression bonding at a pressure of less than about 10 MPa may result in insufficient bonding between ceramic green sheets, and accordingly, cause delamination. After the temporal compression bonding, the stack was fully compression-bonded at a pressure of, for example, about 20 MPa to about 250 MPa. Compression bonding at a pressure of less than about 20 MPa may result in insufficient bonding between upper and lower ceramic green sheets, and accordingly, cause delamination. In contrast, compression bonding at a pressure of more than about 250 MPa may break the monolithic ceramic capacitors or the conductor pattern. After the full compression bonding, the compressed body was fired in an air atmosphere of about 870° C., and the sheets defining the constraining layers were removed. Thus, the ceramic multilayer substrate with a thickness of about 0.5 mm was completed.

On the other hand, as Comparative Example 1, a ceramic multilayer substrate was produced in the same manner as in Example 1, except that the monolithic ceramic capacitors whose elementary ceramic bodies are not coated with a thermally decomposable resin.

Evaluation of Ceramic Multilayer Substrate

Four thousand monolithic ceramic capacitors in each ceramic multilayer substrate of Example 1 and Comparative Example 1 were checked for cracks by X-ray flaw detection. The results are shown in Table 1. Also, the capacitances of the 4000 monolithic ceramic capacitors in each ceramic multilayer substrate of Example 1 and Comparative Example 1 were measured with an LCR meter at 1 MHz. The results are shown in Table 2. The word "components" in Tables 1 and 2 refers to the monolithic ceramic capacitors and the word "substrate" refers to the ceramic multilayer substrate.

TABLE 1

| | Cracked components (number of pieces/4000 pieces) |
|---|---|
| Example 1 | 0 |
| Comparative Example 1 | 56 |

TABLE 2

| | Variation in capacitance (3 CV/%) |
|---|---|
| Example 1 | 4.0 |
| Comparative Example 1 | 5.1 |

Table 1 shows that no monolithic ceramic capacitor was cracked in Example 1. This suggests that the paste layer between each monolithic ceramic capacitor and the ceramic layers burned and decomposed to form a gap to prevent the monolithic ceramic capacitor from coming into close contact with the ceramic layers, and that consequently, the ductile in-plane conductors reduces the thermal stress resulting from the difference in thermal expansion coefficient caused after firing.

In contrast, 56 of 4000 components were cracked in the Comparative Example. This suggests that the monolithic ceramic capacitors tightly adhere to the ceramic layers, and that consequently, a strain was applied between the ceramic layers and the monolithic ceramic capacitors when the monolithic ceramic capacitors shrink much more than the ceramic layers during cooling after firing.

Table 2 shows that the variation in capacitance among the ceramic chip electronic components in the ceramic multilayer substrate of Example 1 was not substantially changed. This suggests that in the ceramic multilayer substrate of Example 1, gaps were formed between the monolithic ceramic capacitors and the ceramic layers during firing and prevented the monolithic ceramic capacitors from coming into close contact with the ceramic layers, and consequently, that the constituents of the monolithic ceramic capacitors and the ceramic layers were not mutually diffused.

In contrast, the variation in capacitance among the ceramic chip electronic components in the ceramic multilayer substrate of Comparative Example 1 was increased. This suggests that the monolithic ceramic capacitors tightly adhered to the ceramics, and consequently, that the constituents of the monolithic ceramic capacitors and the ceramic layers mutually diffused to increase the variation in capacitance.

EXAMPLE 2

Production of Ceramic Multilayer Substrate

In the present example, a ceramic multilayer substrate was produced in the same manner as in Example 1, except that monolithic ceramic capacitors were disposed so as to be located at a dept of about 100 μm from the upper surface of the ceramic ceramic multilayer substrate, and a paste containing sintering-resistant material ($Al_2O_3$) was applied as a contact inhibitor onto the monolithic ceramic capacitors instead of the thermally decomposable resin paste used in Example 1.

On the other hand, as a Comparative Example 1 to Example 2, a ceramic multilayer substrate was produced. In this instance, a thermally decomposable resin paste was applied onto the monolithic ceramic capacitors in the same manner as in Example 1 and the monolithic ceramic capacitors were disposed in the same manner as in Example 2.

Evaluation of Ceramic Multilayer Substrate

The ceramic multilayer substrates of Example 2 and Comparative Example 1 were observed for cracks in the monolithic ceramic capacitors by X-ray flaw detection, as in Example 1. The results are shown in Table 3. Also, the capacitances were measured for each ceramic multilayer substrate with an LCR meter in the same manner as in Example 1. The results are shown in Table 4. Furthermore, surface mount components were mounted on the surface of each ceramic multilayer substrate and the ceramic multilayer substrates were checked for cracks.

TABLE 3

| | Cracked components (number of pieces/4000 pieces) |
|---|---|
| Example 2 | 0 |
| Comparative Example 1 | 0 |

TABLE 4

| | Variation in capacitance (3 CV/%) |
|---|---|
| Example 2 | 4.0 |
| Comparative Example 1 | 3.9 |

Tables 3 and 4 show that no crack was found in the monolithic ceramic capacitors in both Example 2 and Comparative Example 1. This suggests that cracks do not occur irrespective of where the monolithic ceramic capacitors are disposed in the ceramic stack.

Table 4 shows that the variation in capacitance among the monolithic ceramic capacitors was substantially the same between Example 2 and Comparative Example 1. This suggests that the property of the monolithic ceramic capacitors is maintained irrespective of where the monolithic ceramic capacitors are disposed in the ceramic stack.

In addition, as a result of the mounting of the surface mount components on each ceramic multilayer substrate of Example 2 and Comparative Example 1, the ceramic multilayer substrate of Example 2 was not cracked, but the ceramic multilayer substrate of Comparative Example 1 was cracked. In Example 2, powder layers are provided between the monolithic ceramic capacitors and the ceramic layers, but not gaps. Accordingly, it was determined that the absence of gaps prevents the occurrence of a crack. In contrast, in Comparative Example 1, the presence of gaps between the ceramic chip electronic components and the ceramic layers resulted in the crack.

EXAMPLE 3

Production of Ceramic Multilayer Substrate

In the present example, a ceramic multilayer substrate was prepared in the same manner as in Example 1, except that varied amounts of sintering agent for low-temperature co-fired ceramic material were added to the constraining layers so that the adhesion of the constraining layers to the stack of the ceramic green sheets was varied to control the shrinkage of the stack in the surface direction, as shown in Table 5.

Evaluation of Ceramic Multilayer Substrate

In the present example, evaluation was performed by X-ray flaw detection in the same manner as in Example 1. The results are shown in Table 5.

TABLE 5

| Sintering agent content (wt %) | Shrinkage (%) | Effect on components and substrate | Number of cracked components in 200 mm substrate (pieces/4000) |
|---|---|---|---|
| 1.7 | −5.1 | Cracks in substrate and components | 125 |
| 1.6 | −5.0 | No problem | 0 |
| 1.4 | −4.0 | No problem | 0 |
| 1.2 | −2.0 | No problem | 0 |
| 1.0 | −1.0 | No problem | 0 |
| 0.5 | 0 | No problem | 0 |
| 0.3 | +1.0 | No problem | 0 |
| 0.2 | +3.0 | No problem | 0 |
| 0.1 | +5.0 | No problem | 0 |
| 0.0 | +5.1 | Cracks in substrate and components | 114 |

From the results shown in Table 5, it has been determined that a shrinkage of ceramic layers beyond about ±5% results in cracks in both the monolithic ceramic capacitors and the substrate even if firing is performed with the paste layer formed on the elementary ceramic bodies of the monolithic ceramic capacitors. In other words, it is necessary that the shrinkage of the low-temperature co-fired ceramic material of the ceramic layers be limited to within about ±5% even if the paste layer is formed on the monolithic ceramic capacitors. Accordingly, it has been discovered that the sintering agent content in the constraining layer is preferably in the range of about 0.1 to about 1.6 percent by weight, which produces shrinkage within about ±5%.

EXAMPLE 4

Production of Ceramic Multilayer Substrate

The present example used the same materials for the substrate as the Example 1, and the ceramic chip electronic components were disposed in the same manner as in Example 1. In the present example, the same powder paste including a sintering-resistant powder as in Example 2 was applied as a contact inhibitor onto the ceramic chip electronic components. The internal conductor patterns of the ceramic stack and the external terminal electrodes of the ceramic chip electronic components were made of Cu. The ceramic chip electronic components were monolithic ceramic capacitors having a dimension of about 1.6 mm by about 0.8 mm by about 0.3 mm, internal electrodes made of Ni, a firing temperature of about 1200° C., a rated capacitance of about 0.1 µF, and a thermal expansion coefficient of about 10.5 ppm/° C. Ceramic multilayer substrates were prepared at varied firing temperatures as shown in Table 6 in order to investigate the effect of the firing temperature on the powder paste layer.

Evaluation of Ceramic Multilayer Substrate

In the present preferred embodiment, evaluation was performed by X-ray flaw detection in the same manner as in Example 1. The results are shown in Table 6.

TABLE 6

| Firing temperature | Number of cracked components (pieces/4000) |
|---|---|
| 1000° C. | 0 |
| 1050° C. | 0 |
| 1100° C. | 206 |

From the results shown in Table 6, it has been found that if the firing temperature is increased more than about 1050° C., the glass components of the ceramic layers penetrate into the powder layer of the monolithic ceramic capacitors during firing, so that the monolithic ceramic capacitors and the ceramic layers are firmly bonded to each other by the powder layer once the powder layer was sintered. Consequently, the powder layer does not function as intended.

The above described preferred embodiments do not limit the present invention, and any modification is included in the present invention as long as it does not depart from the scope of the present invention.

The present invention can be suitably applied to ceramic multilayer substrates used in electronic apparatuses and to methods for manufacturing the ceramic multilayer substrates.

While preferred embodiments of the present invention have been described above, it is to be understood that variations and modifications will be apparent to those skilled in the art without departing the scope and spirit of the present invention. The scope of the present invention, therefore, is to be determined solely by the following claims.

What is claimed is:

1. A ceramic multilayer substrate comprising:
   a ceramic stack including a plurality of stacked ceramic layers and a conductor pattern; and
   a ceramic chip electronic component disposed at an interface between any two adjacent layers of the plurality of stacked ceramic layers, including a terminal electrode and an elementary body made of a ceramic sintered compact, the terminal electrode being disposed on an end surface of the elementary body extending in a lamination direction of the plurality of stacked ceramic layers, and the elementary body having a gap at an interface between the elementary body and both of the any two adjacent layers of the plurality of stacked ceramic layers.

2. The ceramic multilayer substrate according to claim 1, wherein the ceramic layers are low-temperature co-fired ceramic layers.

3. A ceramic multilayer substrate comprising:
   a ceramic stack including a plurality of stacked ceramic layers and a conductor pattern; and
   a ceramic chip electronic component disposed at an interface between any two adjacent layers of the plurality of stacked ceramic layers, including a terminal electrode and an elementary body made of a ceramic sintered compact, the terminal electrode being disposed on an end surface of the elementary body extending in a lamination direction of the plurality of stacked ceramic layers, and the elementary body including a green ceramic powder disposed at an interface between the elementary body and both of the any two adjacent layers of the plurality of stacked ceramic layers.

4. The ceramic multilayer substrate according to claim 3, wherein the ceramic layers are low-temperature co-fired ceramic layers.

* * * * *